US006785181B2

(12) United States Patent
Karasawa

(10) Patent No.: US 6,785,181 B2
(45) Date of Patent: Aug. 31, 2004

(54) SEMICONDUCTOR MEMORY DEVICE AND ELECTRONIC INSTRUMENT

(75) Inventor: Junichi Karasawa, Tatsuno-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/318,271

(22) Filed: Dec. 12, 2002

(65) Prior Publication Data

US 2003/0117826 A1 Jun. 26, 2003

(30) Foreign Application Priority Data

Dec. 12, 2001 (JP) ........................................ 2001-378988

(51) Int. Cl.$^7$ ............................................... G11C 7/00
(52) U.S. Cl. ........................... 365/226; 365/63; 365/200
(58) Field of Search ................................. 365/226, 200, 365/225.7, 63, 223.03

(56) References Cited

U.S. PATENT DOCUMENTS

| | | | | |
|---|---|---|---|---|
| 5,815,454 A | * | 9/1998 | Tomishima et al. | ......... 365/226 |
| 5,966,340 A | * | 10/1999 | Fujino et al. | ......... 365/230.03 |
| 6,333,877 B1 | * | 12/2001 | Nagaoka et al. | ............ 365/200 |

OTHER PUBLICATIONS

U.S. patent application Ser. No. 10/306,832, Tomohiro, filed Nov. 27, 2002.
U.S. patent application Ser. No. 10/313,910, Miyashita et al., filed Dec. 6, 2002.

* cited by examiner

Primary Examiner—Vu A. Le
(74) Attorney, Agent, or Firm—Hogan & Hartson, LLP

(57) ABSTRACT

A semiconductor memory device has a plurality of sub power source lines for supplying a power source voltage to memory cells, a main power source line for supplying the power source voltage to the sub power source lines, and a plurality of fuse elements for connecting the main power source line to the sub power source lines. Predetermined number of the sub power source lines are commonly connected by one of plurality of common connecting sections. Each of the common connecting sections is disposed at one ends of the sub power source lines. Each of the common connecting sections is connected to the main power source line through each of the fuse elements. The number of the sub power source lines connected to the common connecting section is equal to the number of the sub word lines subordinate to one main word line, and also equal to the number of the redundant sub word lines subordinate to one redundant main word line.

19 Claims, 11 Drawing Sheets

SEMICONDUCTOR MEMORY DEVICE AND ELECTRONIC INSTRUMENT

Japanese Patent Application No. 2001-378988 filed on Dec. 12, 2001 is hereby incorporated by reference in its entirety.

BACKGROUND OF THE INVENTION

The present invention relates to a semiconductor memory device such as an SRAM and an electronic instrument using the same, particularly to a semiconductor memory device capable of preventing leakage current from being generated due to a short circuit in a pattern inside a memory cell, for example, and an electronic instrument using the same.

In this type of semiconductor memory devices, when a defective memory cell is found in the inspection processes, the repair processes are conducted in which the defective memory cell is replaced by a redundant memory cell. For example, a short circuit is generated at the place indicated by a cross between nodes in a memory cell 110 shown in FIG. 5. In this case, a sub word line SWL connected to the defective memory cell 110 where the short circuit has been generated is not selected.

However, even though the sub word line SWL is in the state not to be selected, the short circuit indicated by the cross is not eliminated. Therefore, a leakage current passing through a path A is inevitably generated between a Vdd line 140 and a Vss line 142 due to the generation of the short circuit.

In addition, this type of the semiconductor memory devices has a challenge to satisfy both the realization of high integration and high speed. When the realization of high integration is achieved, the number of memory cells in the longitudinal and transverse directions is increased.

When there are a large number of memory cells in the transverse direction, the length of a single Vdd line 140 becomes longer and the number of memory cells connected thereto becomes greater. Thus, the load resistance and the load capacity of the single Vdd line 140 become greater.

It will be no problem when the voltage of the Vdd line 140 is always constant. However, in the mode to hold data of memory cells 110 at low voltage, such as called retention mode, the voltage supplied to the Vdd line 140 is lowered. Therefore, particularly when the retention mode is cancelled to return to the normal operation mode, the time required to return the Vdd line 140 to have the Vdd voltage becomes longer. Accordingly, the time is required until starting data write after canceling the retention mode, and thus the semiconductor memory device cannot be operated at high speed.

SUMMARY OF THE INVENTION

The present invention may provide a semiconductor memory device capable of preventing leakage current from being generated with a defective memory cell and an electronic instrument using the same.

The present invention may also provide a semiconductor memory device capable of satisfying both the realization of high integration and high speed and an electronic instrument using the same.

A semiconductor memory device according to one aspect of the present invention includes a plurality of word lines extending along a first direction; a plurality of memory cells to be selected by each of the word lines, the memory cells being disposed along the first direction and a second direction, the first and second directions intersecting each other; and a plurality of sub power source lines extending along the first direction, each of the sub power source lines supplying a power source voltage to the memory cells arranged along the first direction.

A main power source line supplies the power source voltage to the sub power source lines, and a plurality of fuse elements connects the main power source line to the sub power source lines. A predetermined number of the sub power source lines are connected by one of a plurality of common connecting sections, each of the common connecting sections being provided at one end of the predetermined number of the sub power source lines and being connected to the main power source line through each of the fuse elements.

According to this aspect of the present invention, when a defect is detected in a memory cell connected to any one of the sub word lines, the supply of the power source voltage to a predetermined number of the sub word lines commonly connected to the common connecting section with the defective sub word line is blocked by cutting the corresponding fuse element. This can prevent the leakage current along the path A shown in FIG. 5, or the like.

The leakage current along the path A shown in FIG. 5 can be prevented by blocking the power supply to the single sub power source line connected to the defective memory cell. However, to this end, a fuse element needs to be connected to every sub power source line. Usually, about 2000 lines of sub power source lines, for example, are disposed for a single memory array. Since the number of fuse elements increases too much, it is difficult to dispose the fuse element at every single sub power source line arranged at a predetermined pitch.

In this aspect of the present invention, one fuse element is disposed for a predetermined number of the sub power source lines. Accordingly, a common connecting section is provided to bind predetermined number of the sub power source lines at one ends.

The semiconductor memory device can further comprise a plurality of redundant word lines extending along the first direction, and a plurality of redundant memory cells to be selected by each of the redundant word lines, the redundant memory cells being disposed along the first direction and the second direction. In this case, the number of the predetermined number of the sub power source lines commonly connected to each of the common connecting sections may be equal to the number of the redundant word lines, the redundant word lines being replaced when a defective memory cell is detected in the memory cells.

In this configuration, all the memory cells connected to the predetermined number of the sub power source lines commonly connected to the common connecting section can be replaced by the redundant memory cells. Therefore, the power supply is blocked to all the memory cells that will not be selected by the replacement, whereby the entire leakage including the leakage current indicated by a path A shown in FIG. 5 can be prevented.

In this semiconductor memory device, the word lines can have a plurality of main word lines and a plurality of sub word lines, the sub word lines being subordinate to each of the main word lines, each of the sub word lines being connected to the memory cells arranged in the first direction.

Accordingly, one aspect of the invention can also be adapted to the type of semiconductor memory devices that word lines are divided into main and sub word lines. In this case, the sub word lines can be set to have the length of a single sub word line stayed in a block when a memory cell array is divided into blocks in the first direction.

Therefore, in the case of having the main and the sub word lines, the number of the predetermined number of the sub power source lines commonly connected to each of the common connecting sections may be equal to the number of the sub word lines subordinate to each of the main word lines.

This semiconductor memory device can further comprise a plurality of redundant main word lines extending along the first direction, a plurality of redundant sub word lines subordinate to each of the redundant main word lines, and a plurality of redundant memory cells to be selected by each of the redundant sub word lines, the redundant memory cells being disposed along the first direction and the second direction.

In this case, the number of the predetermined number of the sub power source lines commonly connected to each of the common connecting sections may be equal to the number of the redundant sub word lines subordinate to each of the redundant main word lines. In this manner, one main word line and the sub word lines subordinate thereto are replaced as one unit with one redundant main word line and the redundant sub word lines subordinate thereto, so as to repair a defective memory cell. On this account, power does not need to be supplied to the predetermined number of the sub power source lines connected to all the memory cells that will not be selected by the replacement. The power supply is thus blocked, whereby the leakage current carried along the path A shown in FIG. 5 can be prevented.

In this semiconductor memory device, each of the sub power source lines can be formed of at least a single metal layer. The sub power source lines becomes longer by the realization of high integration of the memory cells, whereby the load resistance is increased. The load capacity is also increased because a large number of memory cells are connected thereto. On this account, the sub power source lines are formed of a metal layer having a low sheet resistance, whereby the wiring resistance is lowered.

The metal layer can comprise upper and lower metal layers. In this case, the main power source line and each of the fuse elements can be formed of the upper metal layer, and each of the sub power source lines can be formed of the lower metal layer. Particularly, the fuse element is formed of the upper metal layer so that an opening is formed in a passivation film thereabove and a laser is irradiated to cut the fuse element through the opening.

In this semiconductor memory device, each of the sub power source lines can include a first sub power source line and a second sub power source line, the first sub power source line being located below the second sub power source line, an interlayer dielectric being formed between the first and second sub power source lines. In this case, the second sub power source line may be formed of a metal layer and connected to each of the common connecting sections. In addition, the first sub power source line may be formed of a layer having higher resistance than the second sub power source line and connected to the memory cells arranged along the first direction. Then, the first sub power source line may be connected to the second sub power source line through a via. In other words, the first sub power source line of high resistance is backed by the second sub power source line of a metal layer, whereby the load resistance of the sub power source line can be reduced.

In this semiconductor memory device, a power source voltage Vdd can be supplied to the main power source line and the sub power source lines in a normal operation mode in which the memory cells are read and written, and a voltage lower than the power source voltage can be supplied to the main power source lines and the sub power source lines in a retention mode in which data stored in the memory cells is held at a low voltage.

In returning to the normal operation mode from the retention mode, when the load resistance of the sub power source lines is small, the time for charging up to the power source voltage Vdd can be shortened. Accordingly, the time between canceling the retention mode and starting data writing, for example, can be shortened and high-speed operation becomes possible.

According to another aspect of the present invention, an electronic instrument comprises the above described semiconductor memory device. The electronic instrument, such as portable devices, of low power consumption can be realized by installing the semiconductor memory device capable of preventing the leakage current.

DETAILED DESCRIPTION OF THE EMBODIMENT

Hereafter, the embodiments of the invention will be described with reference to the drawings more specifically.

Plan Layout of the Semiconductor Memory Device

Figure 1:
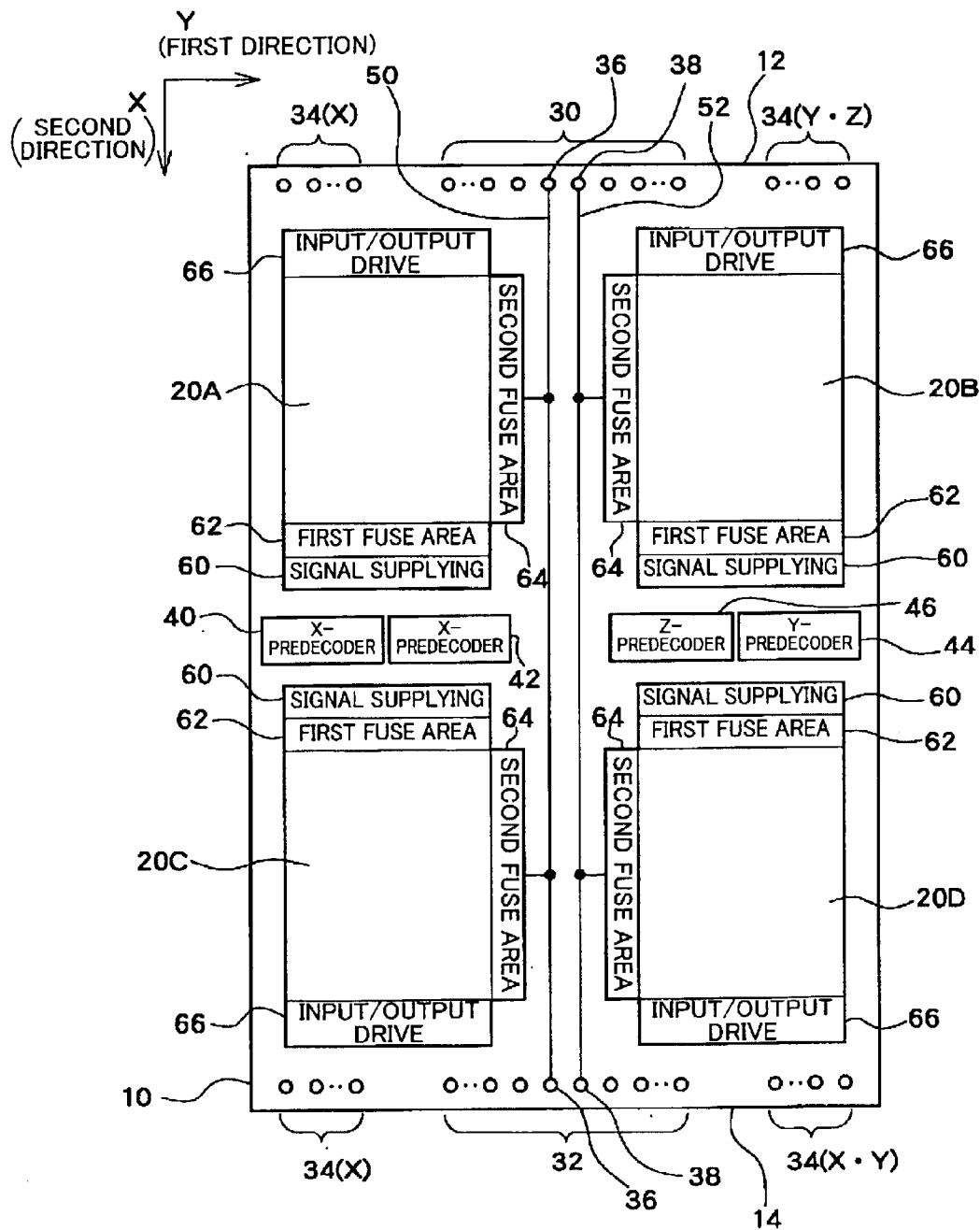
FIG. 1 is a plan layout diagram of a semiconductor memory device (SRAM) in one embodiment of the invention.

FIG. 1 is an exemplary plan layout diagram of a semiconductor memory device in the embodiment of the invention. In addition, this semiconductor memory device is an SRAM (Static Random Access Memory), for example. In FIG. 1, this semiconductor memory device 10 has four memory cell arrays 20A, 20B, 20C and 20D, for example. The memory size of each of the memory cell arrays 20A to 20D is four megabits, 4 M×4=16 MB in total. Furthermore, the invention can also be adapted to those having a single memory cell array.

For example, the semiconductor memory device 16 can write or read 16-bit (two-byte) data at the same time. To two memory cell arrays 20A and 20B on the upper side of FIG. 1, the upper eight bits (upper bytes) of data, for example, is read and written through an input/output terminal group 30 disposed along an upper side 12 of the semiconductor memory device 10. To two memory cell arrays 20C and 20D on the lower side of FIG. 1, the lower eight bits (lower byte) of data is read and written through an input/output terminal group 32 disposed along a lower side 14 of the semiconductor memory device 10.

For example, 20 bits of address signals (X, Y and Z) for writing and reading 16-bit data simultaneously are inputted from address terminal groups 34 disposed along the upper side 12 and the lower side 14 of the semiconductor memory device 10. The address signals X, Y and Z inputted from the address terminal groups 34 are predecoded by X-predecoders 40 and 42, a Y-predecoder 44, and a Z-predecoder 46 disposed in the central area of the semiconductor memory device 10.

Moreover, two memory cell arrays 20A and 20C disposed on the left side of the semiconductor memory device 10, for example, are connected to a first main power source line 50 to which power is supplied by power source terminals 36. Similarly, two memory cell arrays 20B and 20D disposed on the right side of the semiconductor memory device 10, for example, are connected to a second main power source line 52 to which power is supplied by power source terminals 38. In the embodiment, two memory cell arrays connected to the same main power source line are not selected at the same time in order to simultaneously write and read the upper and lower eight-bit data. Accordingly, the memory cell arrays 20A and 20D or the memory cell arrays 20B and 20C are selected at the same time.

Besides, a command terminal is included among the terminal groups disposed along the upper side 12 or the lower side 14 of the semiconductor memory device 10 other than the terminal groups 30 to 38.

In addition, for each of the memory cell arrays 20A to 20D, a signal supplying section 60 and a first fuse area 62 are disposed in one side near the predecoders 40 to 46, and an input/output drive circuit 66 is disposed in the other side near the upper side 12 or the lower side 14. Furthermore, for each of the memory cell arrays 20A to 20D, a second fuse area 64 is disposed in the other side near the power source lines 50 and 52.

Here, a plurality of fuse elements for switching a defective memory cell to a redundant memory cell is arranged in the first fuse area 62. A plurality of fuse elements for blocking the power supply to the defective memory cell is arranged in the second fuse area 64.

Details of the Memory Cell Array

Figure 2:
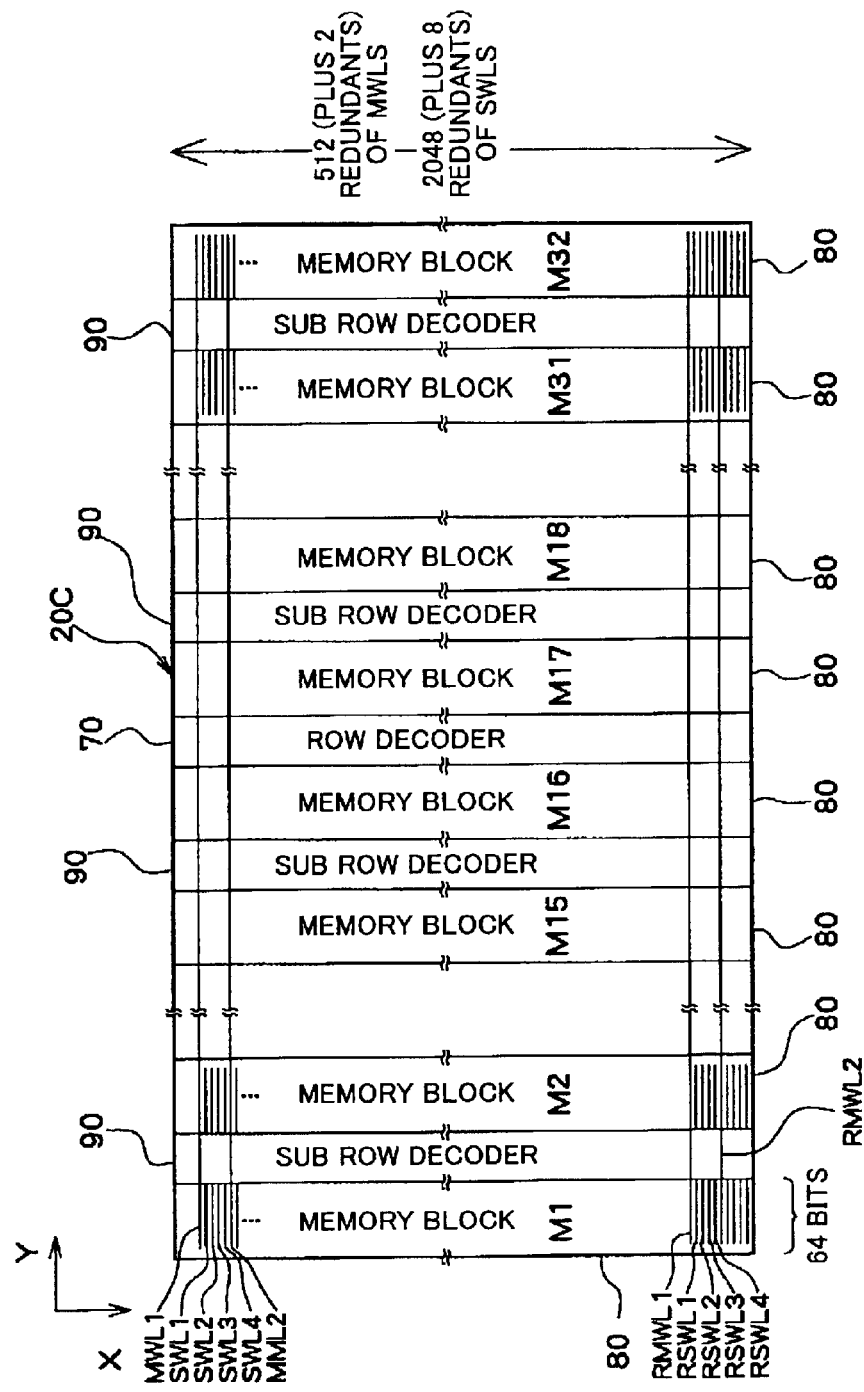
FIG. 2 is a schematic explanatory diagram illustrating the details of one memory cell array shown in FIG. 1.

FIG. 2 is a schematic explanatory diagram illustrating the configuration that the memory cell arrays 20A to 20D have in common. In FIG. 2, the memory cell array 20C, for example, has a row decoder 70 in the center of the Y-direction (first direction). Both sides of the row decoder 70 are split into 16 blocks, divided into 32 blocks of memory blocks 80 (M1 to M32) in total.

The memory size of a single memory block 80 is 64 bits (y-direction)=2048 bits (X-direction)=128 kilobits. The total memory size of 32 blocks of the memory blocks 80 is four megabits. Between two memory blocks 80, a sub row decoder 90 shared by the memory blocks 80 is disposed. Accordingly, 16 pieces of the sub row decoders 90 are disposed. In addition, one sub row decoder 90 may be disposed for each one of the memory blocks 80.

For the memory cell array 20C, 512 lines of main word lines MWL1, MWL2 and so on, for example, are disposed nearly the overall width in the Y-direction. The memory cell array 20C has two lines of redundant main word lines RMWL1 and RMWL2 other than this.

For each of 32 blocks of the memory blocks 80, four sub word lines SWL1 to SWL4, for example, are disposed, which are subordinate to each of 512 lines of the main word lines MWL. There are 2048 lines of the sub word lines SWL in total. Each of 32 blocks of the memory blocks 80 further has eight lines of redundant sub word lines RSWL, which are subordinate to two lines of the redundant main word lines RMWL1 and RMWL2.

Here, the address signals X and Y among the address signals X, Y and Z specify addresses in the X- and Y-directions shown in FIGS. 1 and 2. For example, the address signal Z selects one block from 32 blocks of the memory blocks 80.

The row decoder 70 selects one line from 512 lines of the main word lines MWL based on the X predecode signal. The sub row decoder 90 selects one line from four sub word lines SWL1 to SWL4 subordinate to the selected main word line MWL in a single memory block 80. For the selection from the four sub word lines SWL1 to SWL4, the Z predecode signal (block selection signal ZSB) and the lower four bits of the X predecode signal are used.

In this manner, one sub word line SWL is selected and the input/output drive circuit 66 further selects eight bits of a pair of bit lines based on the Y and Z predecode signals, whereby allowing writing or reading eight-bit data to a single memory block 80. In the embodiment, two memory cell arrays are selected from the four memory cell arrays 20A to 20B at the same time to allow writing or reading eight-bit data (16-bit data in total) in each of the memory blocks 80 in the two memory cell arrays.

Details of the Sub Row Decoder

Figure 3:
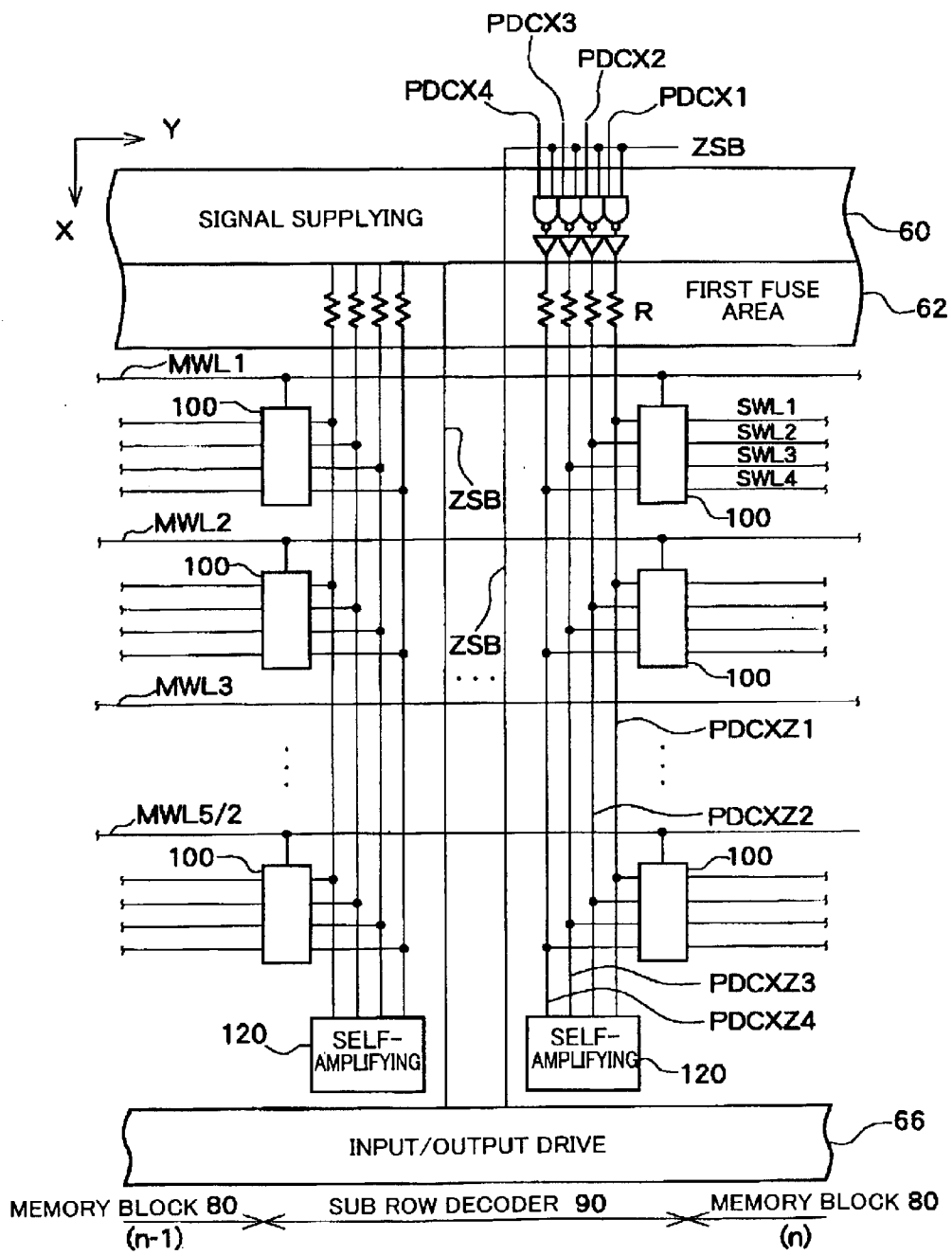
FIG. 3 is a circuit diagram illustrating the details of a sub row decoder shown in FIG. 2.

FIG. 3 illustrates the details of the sub row decoder 90 shared by the (n−1)th and the nth memory block areas 80. Hereafter, the common configuration for selecting the sub word lines SWL1 to SWL4 in the (n−1) th and the nth memory blocks 80 will be described.

To the sub row decoder 90, four sub word selection signal lines (X and Z predecode signal lines) PDCXZ1 to PDCXZ4 are extended along the X-direction (second direction). To the four sub word selection signal lines PDCXZ1 to PDCXZ4, the sub word selection signals to be high active are supplied separately. As shown in FIG. 3, the separate sub word selection signals are created based on the block selection signal ZSB (low active) that the Z-address signal is predecoded by the Z-predecoder 46 and the lower four bits of the X-predecode signals PDCX1 to PDCX4 (low active) that the X-address signal is predecoded by the X-predecoders 40 and 42. In addition, to the sub row decoder 90, the block selection signal line ZSB is extended along the X-direction to the input/output drive circuit 66. The block selection signal line ZSB is used for driving the sense amplifier in the input/output drive circuit 66 or for driving the Y driver (bit line driver).

To select a single sub word line SWL from 512 lines of the main word lines MWL1 to MWL512 and four lines of the sub word selection signal lines PDCXZ1 to PDCXZ4, a switch group 100 made of 512 switches is disposed.

Figure 4:
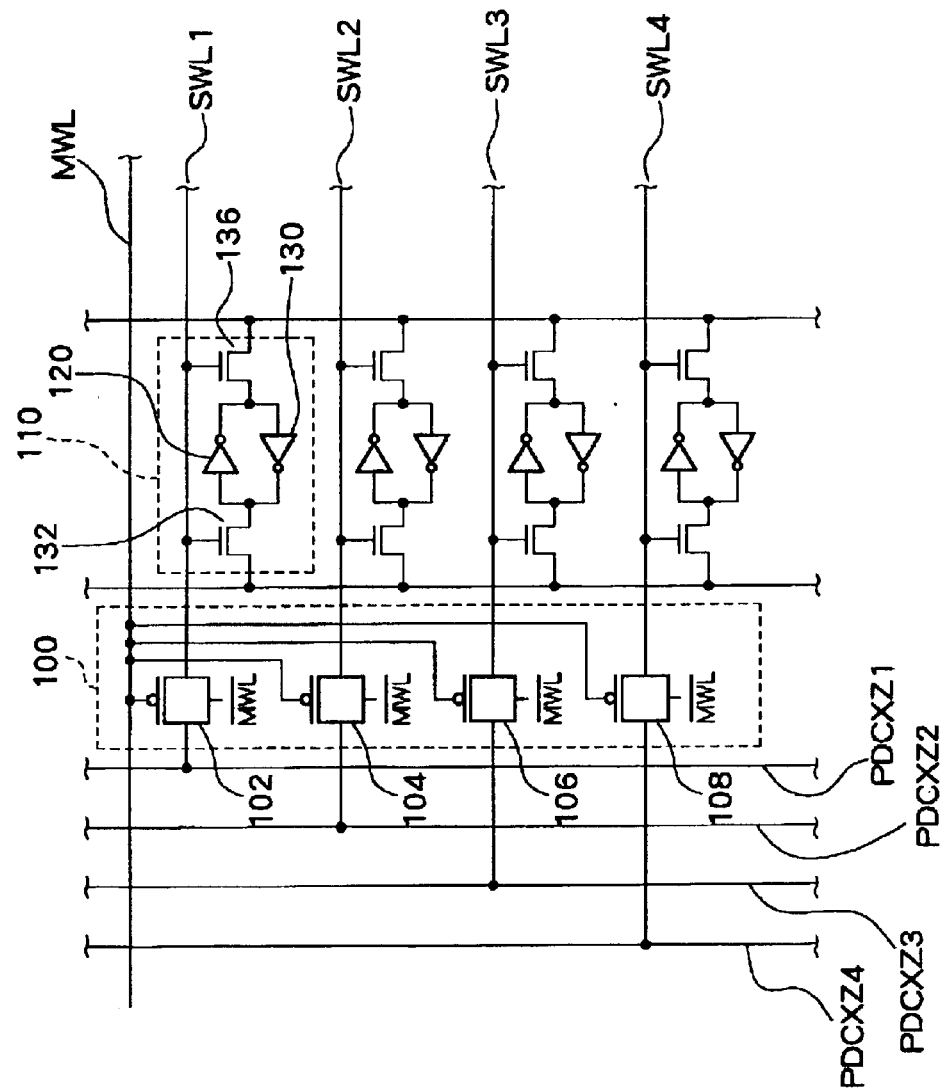
FIG. 4 is a circuit diagram illustrating the relationship among switch groups, a main word line, sub word lines, and sub word selection signal lines in FIG. 3.

As shown in FIG. 4, the switch group 100 has four transfer gates 102, 104, 106 and 108. Each of the transfer gates 102 to 108 switch one line of the four sub word selection signal lines PDCXZ to be connected to or not connected to one sub word line SWL corresponding thereto based on the logic of the main word line MWL and the reverse main word line/MWL. Furthermore, in the embodiment, the main word selection signal at low active is supplied to the main word line MWL.

For example, when the potential of the main word line MWL1 is at low, the potential of the sub word selection signal line PDCXZ1 is at high, and the potential of the other sub word selection signal lines PDCXZ2 to PDCXZ4 are at low, the potential of the sub word line SWL1 subordinate to the main word line MWL1 is turned to be high. Consequently, data read or write is allowed to the memory cells 110 connected to the sub word line SWL1.

Furthermore, however omitted in FIG. 3, the redundant main word lines RMWL1 and RMWL2 and the redundant sub word lines RSWL1 to RSWL4 subordinate to each of them can be similarly selected as well. Accordingly, the redundant memory cells connected to the redundant sub word lines RSWL1 to RSWL4 can be selected.

However, the redundant main word lines RMWL1 and RMWL2 and the redundant sub word lines RSWL1 to RSWL4 subordinate to each of them cannot be selected until a defect is found and repaired in any one of the memory cells 110 connected to the sub word lines SWL1 to SWL4.

Moreover, a unit for replacing the defective memory cell with the redundant memory cell is a unit of one main word line. Therefore, a single main word line MWL and four sub word lines SWL1 to SWL4 subordinate thereto are replaced by one redundant main word line RMWL and four redundant sub word lines 1 to 4 subordinate thereto.

Details of the Memory Cell

Figure 5:
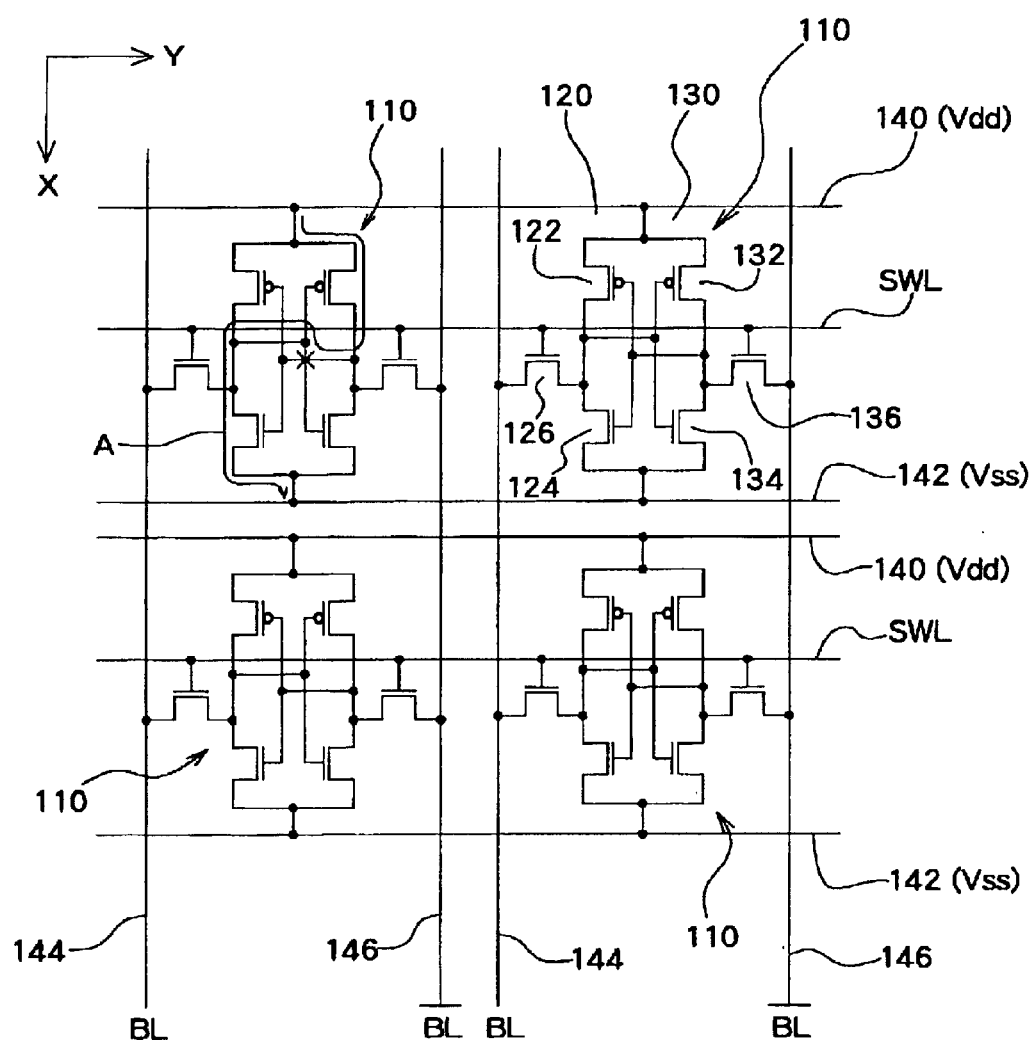
FIG. 5 is a circuit diagram illustrating the details of a memory cell shown in FIG. 4.

FIG. 5 is an equivalent circuit diagram of the SRAM in the embodiment. Each of the memory cells 110 is configured of six MOS field-effect transistors. Each of the memory cells 110 has first and second CMOS inverters 120 and 130. The first CMOS inverter 120 is configured in which a first load transistor (PMOS) 122 is serially connected to a first drive transistor (NMOS) 124 between a sub power source line 140 and a ground wire 142. The second CMOS inverter 130 is also configured in which a second load transistor (PMOS) 132 is serially connected to a second drive transistor (NMOS) 134 between the sub power source line 140 and the ground wire 142. The first and second CMOS inverters 120 and 130 are cross-coupled, whereby a flipflop is formed.

In addition, the first CMOS inverter 120 is connected to a bit line 144 through a first transfer transistor (NMOS) 126. Similarly, the second CMOS inverter 130 is connected to a bit line 146 through a second transfer transistor (NMOS) 136.

Here, the gates of the first and second transfer transistors 126 and 136 are connected to a sub word line SWL. Each sub word line SWL is divided at every memory block 80. To a single sub word line SWL, a group of the memory cells arranged in each memory block 80 along the Y-direction (first direction) is commonly connected.

To a pair of the bit lines 144 and 146, a group of the memory cells arranged in a line in each memory block 80 along the X-direction (second direction) is commonly connected.

In the meantime, the sub power source lines 140 and the ground wires 142 are disposed as crossing 32 blocks of the memory blocks 80 along the Y-direction (first direction). Accordingly, a group of the memory cells in a single row arranged along the Y-direction (first direction) in the memory cell arrays 20A to 20D (about 2 k memory cells in the embodiment) is commonly connected to a single sub power source line 140.

Details of the Sub Power Source Line

Figure 6:
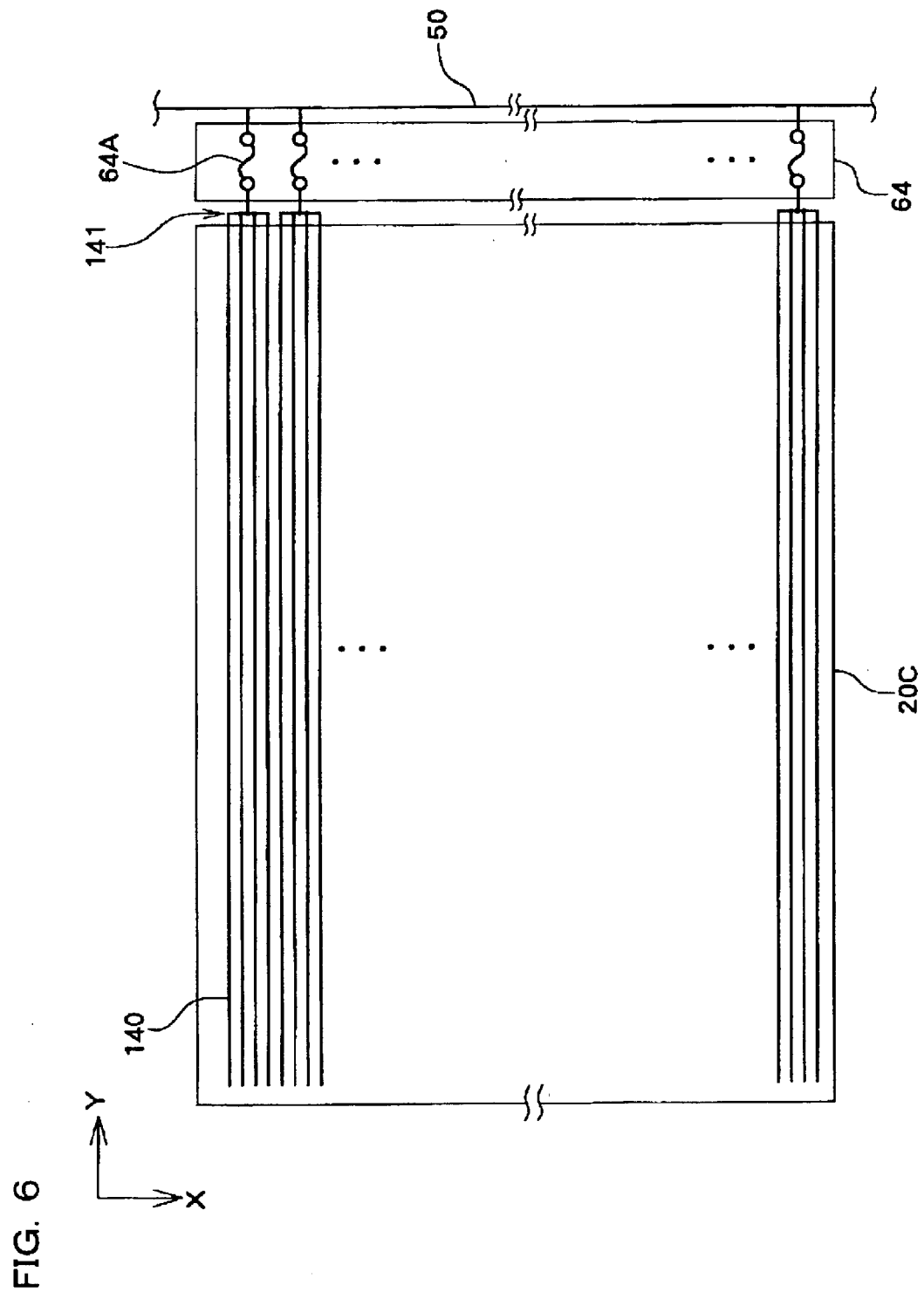
FIG. 6 is a plan view illustrating the connection state of sub power source lines, common connecting sections, fuse elements, and a main power source line.

FIG. 6 illustrates the layout of a plurality of the sub power source lines 140 in one of the memory cell arrays 20A to 20D, in the memory cell array 20C, for example. As shown in FIG. 6, all the sub power source lines 140 are commonly connected at every four lines at one end part in the Y-direction. In the four sub power source lines 140, one end part in the Y-direction is called common connecting section 141.

As shown in FIG. 6, each of a plurality of the common connecting sections 140 is connected to the main power source line 50 extended along the X-direction through fuse elements 64A disposed in the second fuse area 64.

Here, the number of the sub power source lines 140 commonly connected to the common connecting section 141 is matched to the number of the sub word lines SWL (four lines) subordinate to a single main word line MWL. Furthermore, the number of the sub power source lines 140 connected to the common connecting section 141 is matched to the number of the redundant sub word lines RSWL (four lines) subordinate to a single redundant main word line RMWL.

Because of such the configuration, when the fuse element 64A is cut, the supply of the power source voltage Vdd can be blocked to the four sub power source lines 140 from the main power source line 50. The reason is as follows.

Among four memory cells 110 shown in FIG. 5, suppose a short circuit is generated at the place indicated by the cross in the wiring pattern of the upper left memory cell 110, for example. In this case, repair is conducted so as not to select one main word line to which a single sub word line SWL connected to this defective memory cell 110 is subordinate.

Accordingly, four sub word lines SWL1 to SWL4 subordinate to the main word line MWL are not selected in all 32 blocks of the memory blocks 80 as well. Instead of this, one redundant word line RMWL and four redundant sub word lines RSWL1 to RSWL4 subordinate thereto are selectively replaced.

Here, the defective memory cell 110 shown in FIG. 5 is not selected, and thus the false potential from the defective memory cell 110 is inhibited to output to a pair of the bit lines 144 and 146 connected thereto.

However, the short circuit indicated by the cross shown in FIG. 5 is not eliminated in the defective memory cell 110. When the short circuit state is generated at the cross, a leakage current is to be carried along the path A between the sub power source line 140 and the ground wire 142. This leakage current cannot be eliminated only by the repair of replacing the defective memory cell with the redundant memory cell.

Then, in such the case, the power supply is blocked to all the memory cells 110 connected to a set of four sub word lines SWL (four lines subordinate to one main word line MWL) including one line connected to the defective memory cell 110.

Four sub power source lines 140 in total are connected to the memory cells 110. Then, as shown in FIG. 6, one fuse element 64A connected to the corresponding four sub power source lines 140 is cut by laser beams, for example.

Cutting the fuse element 64A blocks the supply of power source voltage to four rows of the entire memory cells 110 including the defective memory cell 110, and thus the leakage current indicated by the path A in FIG. 5 can be prevented from being carried.

Here, the reason why the power supply is blocked to the four sub power source lines 140 is that the entire memory cells 110 connected to the four sub power source lines 140 are replaced by the redundant memory cells. The power supply is blocked to all the memory cells 110 that will not be selected, whereby all the leakage including the leakage current indicated by the path A can be prevented.

To prevent the leakage current indicated by the path A, it is enough to block only one sub power source line 140 connected to the defective memory cell 110. To this end, fuse elements 64A need to be connected to all the sub power source lines 140 beforehand. However, it is very difficult to arrange the fuse elements at the same pitches as those of the sub power source lines 140, and it is unnecessary to supply power to the other three rows of the memory-cells 110 not selected. Therefore, the configuration was adapted in which four sub power source lines 140 are formed into one set and the power supply to them is blocked collectively.

Materials of the Sub Power Source Line

Figure 7:
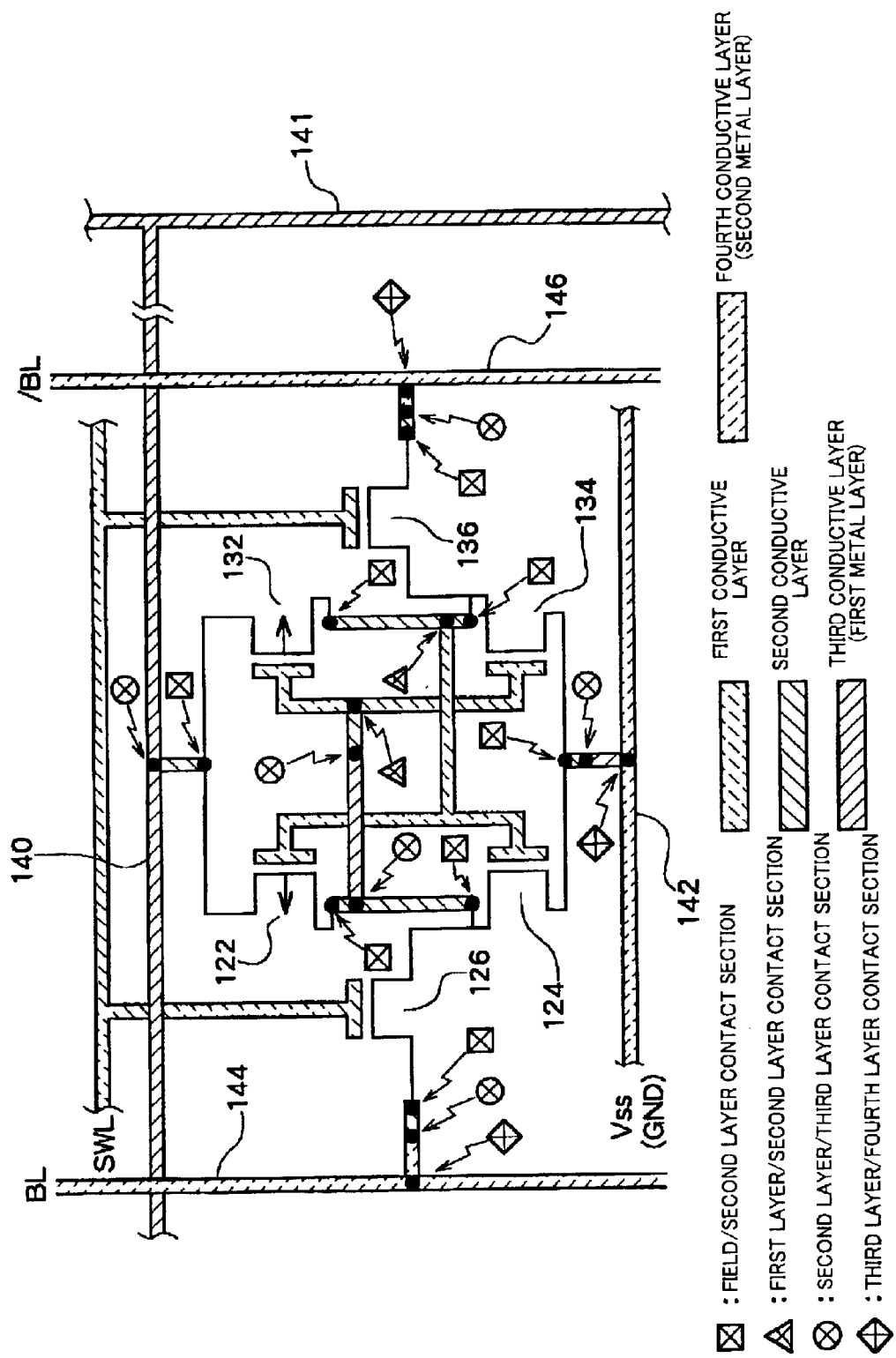
FIG. 7 is a plan view illustrating the field pattern of the SRAM in the embodiment.

FIG. 7 is a plan view schematically illustrating the field of the memory cell 110 of the SRAM in the embodiment. As shown in FIG. 7, this memory cell 110 has four conductive layers. The undermost first conductive layer is a laminated layer of a polysilicon layer and a silicide layer, and the second conductive layer is a nitride layer of a high melting point metal, such as a titanium nitride layer. The third conductive layer is a first metal layer such as a first aluminium layer, and the fourth conductive layer is a second metal layer such as a second aluminium layer.

Here, the sub power source line 140 is formed of the third conductive layer, that is, the first metal layer (first aluminium layer, for example). In addition, however omitted in FIG. 7. the main power source lines 50 and 52 and the fuse element 64A are formed of the fourth conductive layer, that is, the second metal layer (second aluminium layer, for example) Particularly, the fuse element 64A needs to be formed of the uppermost wiring layer as blockable by laser beams. Furthermore, an opening is formed in a passivation film in the upper layer facing to the fuse element 64A, allowing the laser beams to directly be irradiated onto the fuse element 64A.

Next, the reason why the sub power source line 140 was formed of the metal layer will be described. As described above, about 2 k blocks of the memory cells 110 are connected to a single sub power source line 140. Therefore, the length of the sub power source line 140 in the Y-direction is elongated and the load resistance is increased, also growing the load capacity.

Traditionally, the sub power source line 140 has been tried to form of the second conductive layer (titanium nitride layer, for example). However, a problem has arisen that time is required to return to the normal operation mode from the retention mode.

Here, the normal operation mode is the operation mode that allows reading and writing data to the memory cells 110. In this normal operation mode, the power source voltage Vdd is supplied to the sub power source line 140. In the normal operation mode, the lowest value of the Vdd voltage is about 2.7V, for example.

In the meantime, the retention mode is the mode that holds data stored in the memory cells 110 in the state of a lowered power source voltage, inhibiting data read and write during the retention mode. During the retention mode, the voltage supplied to the sub power source line 140 is about 1.2V, for example.

Figure 8:
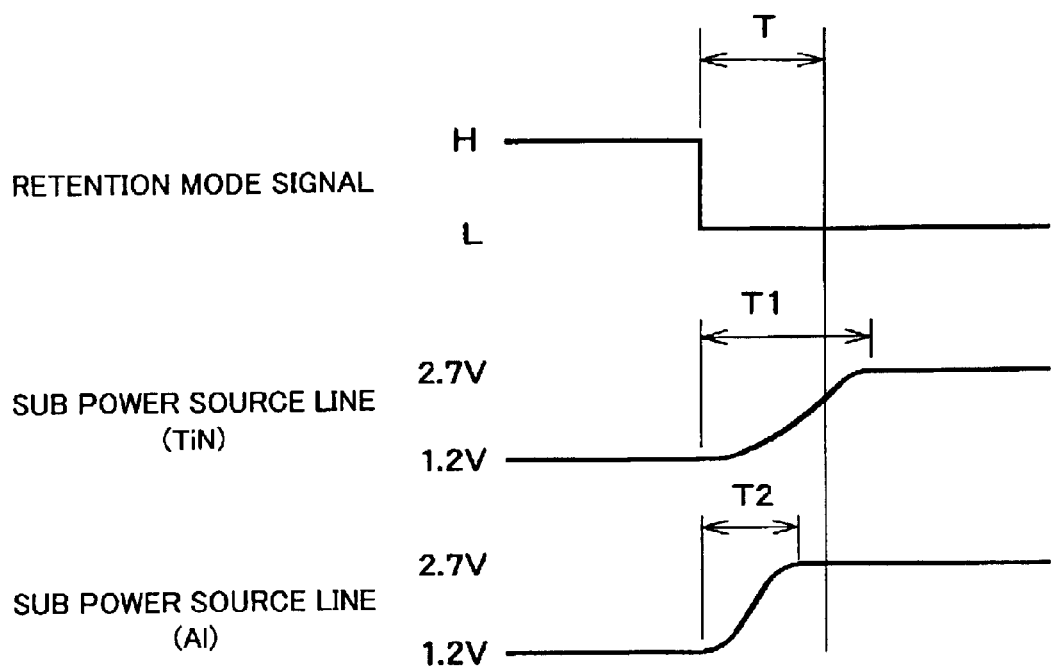
FIG. 8 is a timing chart for describing the potential variation of the sub power source line in returning to the normal operation from the retention mode on materials of the sub power source line.

The sheet resistance of the titanium nitride layer is as great as 15 ohms, whereas the sheet resistance of metals such as aluminum is significantly as low as 60 milliohms. The difference in the sheet resistances generates differences in the discharge time as shown in FIG. 8.

FIG. B shows the voltage variation of the sub power source line 140 when the retention mode signal is turned to be low from high, transferring to the normal operation mode from the retention mode. Time T1 that the sub power source line 140 formed of TiN is required to return to a voltage of 2.7V from a voltage of 1.2V is longer than Time T2 that the sub power source line 140 formed of Al is required to return to a voltage of 2.7V from a voltage of 1.2V.

Here, Time T required to start data read out, for example, of the memory cells 110 after the retention mode has been finished is as short as 100 nanoseconds, for example. Therefore, when the sub power source line 140 was formed of TiN and the length of the sub power source line 140 and the number of memory cells connected thereto are increased, it becomes T1>T, as shown in FIG. 8. When data is read out of the memory cells 110 in this state, the logic that should be high is recognized wrong as low.

In this embodiment, the sub power source line 140 was formed of a metal layer, whereby allowing the time to return to the normal operation mode from the retention mode to be shortened.

Other Exemplary Materials of the Sub Power Source Line

Figure 9:
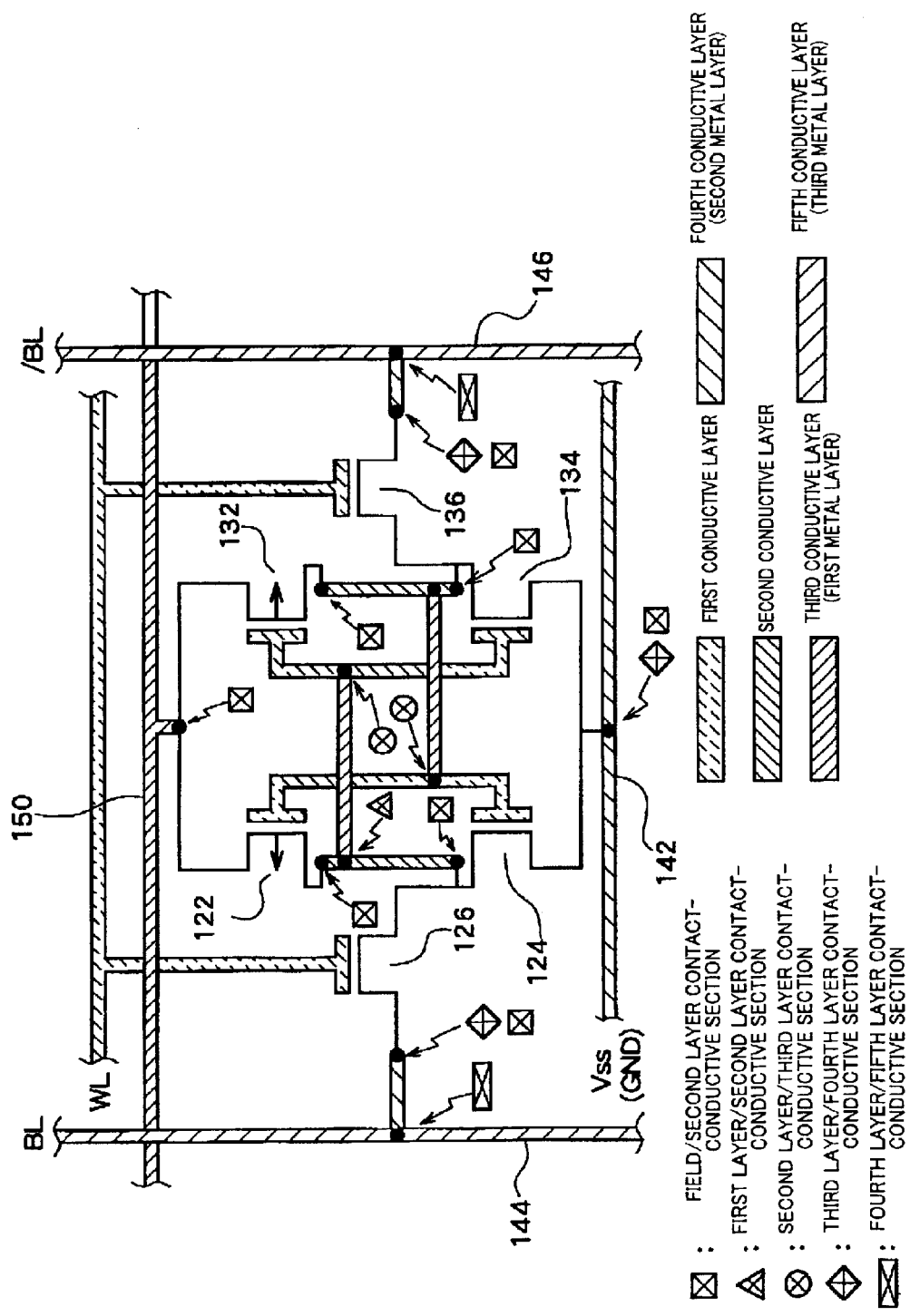
FIG. 9 is a plan view illustrating the field pattern of an SRAM different from that shown in FIG. 7.

FIG. 9 is a plan view schematically illustrating the field of a memory cell 110 of an SRAM in the embodiment different from that shown in FIG. 7. As shown in FIG. 9, this memory cell 110 has five conductive layers. From the first conductive layer through the fourth conductive layer, the same materials as those shown in FIG. 7 are used. The fifth conductive layer added in the case shown in FIG. 9 is a third metal layer such as an aluminium layer.

Here, a sub power source line 150 is formed of the second conductive layer such as a titanium nitride layer different from that shown in FIG. 7. Remaining as it is, the long Time T1 is required to return to the normal operation mode from the retention mode as shown in FIG. 8.

Then, the sub power source layer is formed to have two layers. More specifically, a backing layer for a second sub power source layer 140 shown in FIG. 6 is further formed of the first metal layer (first aluminium layer, for example) to be the third conductive layer placed in the upper layer through the interlayer dielectric layer or second metal layer (second aluminium layer, for example) to be the fourth conductive layer, in addition to the first sub power source layer 150 shown in FIG. 9 formed of the titanium nitride layer. The first sub power source layer 150 is connected to the second sub power source layer 140 through a via.

Thus formed, the second sub power source layer 140 to be a low resistant layer can solve the problem. Furthermore, the second sub power source layer 140 is connected to the main power source line 50 through the common connecting section 141 and the fuse element 64A, and thus the leakage current shown in FIG. 5 can also be prevented from being generated.

Moreover, in the case of the layout shown in FIG. 9, the main power source lines 50 and 52 and a plurality of the fuse elements 64A can be formed of the third metal layer to be the uppermost fifth conductive layer (third aluminium layer, for example).

Description of Electronic Instruments

Figure 10:
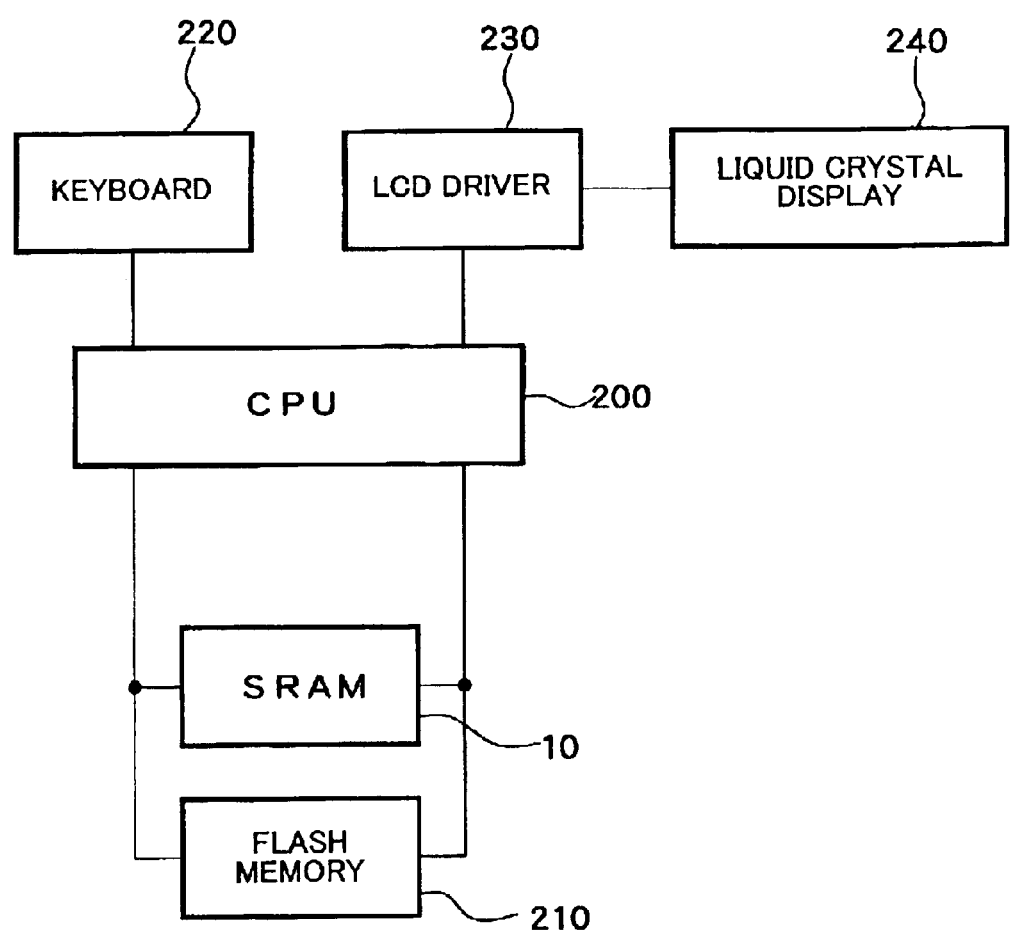
FIG. 10 is a block diagram of a part of the system of a cellular phone using the semiconductor memory device shown in FIG. 1.

This semiconductor memory device 10 can be used for electronic instruments such as portable devices. FIG. 10 is a block diagram of a part of a system of a cellular phone. The SRAM is the semiconductor memory device 10. A CPU 200, the SRAM 10 and a flash memory 210 are connected each other by bus lines. In addition, the CPU 200, the SRAM 1o and the flash memory 210 are connected each other by bus lines for transmitting address signals $A_0$ to $A_{19}$, data signals $1/O_0$ to $1/O_{15}$ and commands. Furthermore, the CPU 200 is connected to a keyboard 220 and an LCD driver 230 by bus lines. The LCD driver 230 is connected to a liquid crystal display part 240 by a bus line. The memory system is configured of the CPU 200, the SRAM 10 and the flash memory 210.

Figure 11:
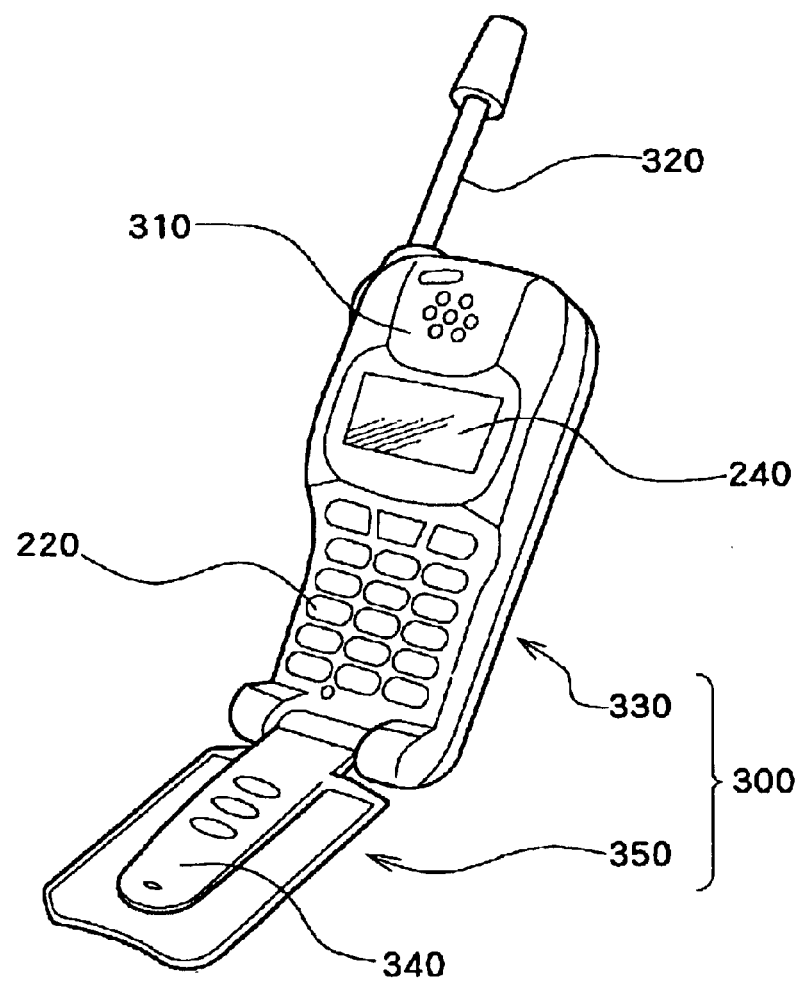
FIG. 11 is an outline perspective view of a cellular phone using the system shown in FIG. 10.

FIG. 11 is a perspective view of a cellular phone 300 equipped with the system of the cellular phone shown in FIG. 10. The cellular phone 300 has a main body part 330 including a receiver part 310 and an antenna part 320, and a cover part 350 including a transmitter part 340 other than the keyboard 220 and the liquid crystal display part 240.

In addition, the invention is not limited to the embodiments described above, which can be modified variously within the scope of the teachings of the invention. For example, the invention is not limited only to the SRAM, which can be adapted to all the semiconductor memory devices selecting memory cells with the main word lines and the sub word lines.

What is claimed is:

1. A semiconductor memory device comprising:
   a plurality of word lines extending along a first direction;
   a plurality of memory cells to be selected by each of the word lines, the memory cells being disposed alone the first direction and a second direction, the first and second directions intersecting each other;
   a plurality of sub power source lines extending along the first direction, each of the sub power source lines supplying a power source voltage to the memory cells arranged along the first direction;
   a main power source line supplying the power source voltage to the sub power source lines;
   a plurality of fuse elements connecting the main power source line to the sub power source lines;
   a plurality of redundant word lines extending along the first direction; and
   a plurality of redundant memory cells to be selected by each of the redundant word lines, the redundant memory cells being disposed along the first direction and the second direction,
   wherein a predetermined number of the sub power source lines are connected by one of a plurality of common connecting sections, each of the common connecting sections being provided at one end of the predetermined number of the sub power source lines and being connected to the main power source line through each of the fuse elements, and
   wherein the number of the predetermined number of the sub power source lines commonly connected to each of the common connecting sections is equal to the number of the redundant word lines, the redundant word lines being replaced when a defective memory cell is detected in the memory cells.

2. A semiconductor memory device comprising:
   a plurality of word lines extending along a first direction;
   a plurality of memory cells to be selected by each of the word lines, the memory cells being disposed along the first direction and a second direction, the first and second directions intersecting each other;
   a plurality of sub power source lines extending along the first direction, each of the sub power source lines supplying a power source voltage to the memory cells arranged along the first direction;
   a main power source line supplying the power source voltage to the sub power source lines; and
   a plurality of fuse elements connecting the main power source line to the sub power source lines,
   wherein a predetermined number of the sub power source lines are connected by one of a plurality of common connecting sections, each of the common connecting sections being provided at one end of the predetermined number of the sub power source lines and being connected to the main power source line through each of the fuse elements,
   wherein the word lines have a plurality of main word lines and a plurality of sub word liner, the sub word lines being subordinate to each of the main word lines, each of the sub word lines being connected to the memory cells arranged in the first direction, and
   wherein the number of the predetermined number of the sub power source lines commonly connected to each of tho common connecting sections is equal to the number of the sub word lines subordinate to each of the main word lines.

3. The semiconductor memory device as defined in claim 2 further comprising:
   a plurality of redundant main word lines extending along the first direction;
   a plurality of redundant sub word lines subordinate to each of the redundant main word lines; and
   a plurality of redundant memory cells to be selected by each of the redundant sub word lines, the redundant memory cells being disposed along the first direction and the second direction,
   wherein the number of the predetermined number of the sub power source lines commonly connected to each of the common connecting sections is equal to the number of the redundant sub word lines subordinate to each of the redundant main word lines.

4. The semiconductor memory device as defined in claim 1,
   wherein each of the sub power source lines is formed of at least a single metal layer.

5. The semiconductor memory device as defined in claim 4,
   wherein the metal layer comprises upper and lower metal layers,
   wherein the main power source line and each of the fuse elements are formed of the upper metal layer, and
   wherein each of the sub power source lines is formed of the lower metal layer.

6. A semiconductor memory device comprising:
   a plurality of word lines extending along a first direction;
   a plurality of memory cells to be selected by each of the word lines, the memory cell being disposed along the first direction and a second direction, the first and second directions intersecting each other;
   a plurality of sub power source lines extending along the first direction, each of the sub power source lines supplying a power source voltage to the memory cells arranged along the first direction;
   a main power source line supplying the power source voltage to the sub power source lines; and
   a plurality of fuse elements connecting the main power source line to the sub power source lines,
   wherein a predetermined number of the sub power source lines are connected by one of a plurality of common connecting sections, each of the common connecting sections being provided at one end of the predetermined number of the sub power source lines and being connected to the main power source line through each of the fuse elements.
   wherein each of the sub power source lines includes a first sub power source line and a second sub power source line, the first sub power source line being located below the second sub power source line, an interlayer dielectric being formed between the first and second sub power source lines,
   wherein the second sub power source line is formed of a metal layer and connected to each of the common connecting sections,
   wherein the first sub power source line is formed of a layer having higher resistance than the second sub power source line and connected to the memory cells arranged along the first direction, and
   wherein the first sub power source line is connected to the second sub power source line through a via.

7. The semiconductor memory device as defined in claim 4,
wherein a power source voltage Vdd is supplied to the main power source line and the sub power source lines in a normal operation mode in which the memory cells are read and written, and
wherein a voltage lower than the power source voltage is supplied to the main power source lines and the sub power source lines in a retention mode in which data stored in the memory cells is held at a low voltage.

8. An electronic instrument comprising the semiconductor memory device as defined in claim 1.

9. The semiconductor memory device as defined in claim 1, wherein the memory device includes four memory cell arrays.

10. The semiconductor memory device as defined in claim 1, wherein the memory device includes a single memory cell array.

11. The semiconductor memory device as defined in claim 9, wherein each memory cell array includes a row decoder.

12. The semiconductor memory device as defined in claim 9, wherein each memory cell array includes a sub row decoder.

13. The semiconductor memory device as defined in claim 4, wherein the metal layer is made of aluminum.

14. The semiconductor memory device as defined in claim 1, wherein each of the sub power source lines includes a first conductive layer.

15. The semiconductor memory device as defined in claim 14, wherein the first conductive layer is a laminated layer of a polysilicon layer and a silicide layer.

16. The semiconductor memory device as defined in claim 1, wherein each of the sub power source lines includes a second conductive layer.

17. The semiconductor memory device as defined in claim 16, wherein the second conductive layer is a titanium nitride layer.

18. A semiconductor memory device comprising:
a plurality of word lines extending along a first direction;
a plurality of memory cells to be selected by each of the word lines, the memory cells being disposed along the first direction and a second direction, the first and second directions intersecting each other;
a plurality of sub power source lines extending along the first direction, each of the sub power source lines supplying a power source voltage to the memory cells arranged along the first direction;
means for supplying the power source voltage to the sub power source lines; and
a plurality of fuse elements connecting the means for supplying the power source voltage to the sub power source lines,
wherein a predetermined number of the sub power source lines are connected by one of a plurality of common connecting sections, each of the common connecting sections being provided at one end of the predetermined number of the sub power source lines and being connected to the means for supplying the power source voltage through each of the fuse elements;
wherein the word lines have a plurality of main word lines and a plurality of sub word lines, the sub word lines being subordinate to each of the main word lines, each of the sub word lines being connected to the memory cells arranged in the first direction, and
wherein the number of the predetermined number of the sub power source lines commonly connected to each of the common connecting sections is equal to the number of the sub word lines subordinate to each of the main word lines.

19. A method for preventing leakage current in a semiconductory memory device comprising:
extending a plurality of word lines in a first direction;
selecting plurality of memory cells by each of the word lines;
disposing the memory cells along the first direction, and a second direction, wherein the first and second directions intersect each other;
extending a plurality of sub power source lines along the first direction,
supplying a power source voltage to the memory cells arranged along the first direction;
supplying the power source voltage to the sub power source lines; and
connecting the main power source line to the sub power source lines by a plurality of fuse elements;
connecting one of a plurality of common connecting sections, by a predetermined number of sub power source lines;
providing at one end of the predetermined number of the sub power source lines each of the common connecting sections; and connecting each of the common connecting sections to the main power source line through each of the fuse elements;
providing a plurality of main word lines and a plurality of sub word lines, the sub word lines being subordinate to each of the main word lines,
connecting each of the sub word lines to the memory cells arranged in the first direction,
wherein the number of the predetermined number of the sub power source lines commonly connected to each of the common connecting sections is equal to the number of the sub word lines subordinate to each of the main word lines.

* * * * *